United States Patent [19]

Katakura et al.

[11] 4,433,254

[45] Feb. 21, 1984

[54] LEVEL DETECTING CIRCUIT

[75] Inventors: Masayuki Katakura; Kenzo Akagiri, both of Yokohama; Motomi Ookouchi, Tokyo, all of Japan

[73] Assignee: Sony Corporation, Tokyo, Japan

[21] Appl. No.: 325,207

[22] Filed: Nov. 27, 1981

[30] Foreign Application Priority Data

Nov. 27, 1980 [JP] Japan .................... 55-165848
Dec. 5, 1980 [JP] Japan .................... 55-171825

[51] Int. Cl.³ ............................................. H03K 5/08
[52] U.S. Cl. .................................. 307/350; 307/359; 307/492; 307/542; 328/145
[58] Field of Search ............... 307/350, 359, 358, 542, 307/546, 562, 492, 494, 261; 328/145, 150, 149

[56] References Cited

U.S. PATENT DOCUMENTS 3,657,528 4/1972 Plante .................... 328/145

Primary Examiner—John Zazworsky
Attorney, Agent, or Firm—Lewis H. Eslinger; Alvin Sinderbrand

[57] ABSTRACT

A level detecting circuit for producing a level detected output signal in response to an input signal includes a logarithmic converting amplifier which logarithmically converts the input signal into a logarithmically converted signal; a differential error amplifier which produces a logarithmically amplified signal in response to the logarithmically converted signal and at least one feedback signal; an integrating capacitor supplied with the logarithmically amplified signal through a PN junction for producing an integrated signal; a voltage dividing circuit for voltage dividing the integrated signal and the logarithmically amplified signal in accordance with a selected ratio and supplying at least one resultant voltage divided signal as the at least one feedback signal to the differential error amplifier; and an output PN junction for producing the level detected output signal in response to the integrated signal.

20 Claims, 9 Drawing Figures

LEVEL DETECTING CIRCUIT

BACKGROUND OF THE INVENTION

1. Field of the Invention

This invention relates generally to level detecting circuits and, more particularly, is directed to a level detecting circuit of the logarithmic compression type.

2. Description of the Prior Art

Noise reduction circuits for reducing noise and distortion which accompany a reproduced information signal are well-known in the art. Such noise reduction circuits are designed to increase the dynamic range of the signal that can be recorded and reproduced from a recording medium such as a magnetic tape. Such noise reduction circuits generally incorporate an encoding process which compresses the level of the information signal prior to recording the signal on the recording medium, and a decoding process which expands the level of the information signal, during the reproducing operation, with a characteristic which is complementary to the compression characteristic. As a result, various restrictions imposed on the dynamic range of the information signal by the signal transmission paths and the recording medium can be eliminated.

One such noise reduction circuit uses a transmission circuit having a variable compression/expansion characteristic which is dependent on the level and/or frequency of the input information signal. Such transmission circuit has a gain controlled amplifier, such as a voltage controlled amplifier, which effects the aforementioned compression and expansion operations, and a level detecting circuit which supplies a control voltage corresponding to the input information signal to the voltage controlled amplifier for controlling the variable compression/expansion characteristic.

However, voltage controlled amplifiers and level detecting circuits having greater precision and being adapted to greatly increase the dynamic range of the information signal have recently been required in audio tape recorders for greatly reducing noise accompanying the information signal. It is also desirable that such circuits overcome various problems with the information signal caused by noise modulation and overshoots in the signal. Accordingly, where it is required that the dynamic range used with a noise reduction circuit exceeds 60 dB, it is desirable to use an exponential-to-logarithmic conversion circuit or logarithmic compression circuit for the level detecting circuit which produces the control voltage. An effective value level detecting circuit of the logarithmic compression type is disclosed in U.S. Pat. No. 3,681,618.

When the level of the input information signal is abruptly increased, the resulting reproduced output signal has a corresponding overshoot portion which is substantially greater than the desired level of the output signal. The time within which this overshoot portion falls back to its desired level is termed the attack time or rise time constant. However, it becomes difficult to choose a correct attack time since an attack time which is too long will distort the sound which is eventually reproduced and an attack time that is too short will result in a clicking noise in the reproduced sound. An optimum attack time is therefore set in the range of approximately 100 μsec. to 10 msec. In like manner, when the input signal level falls from a high value to a low value, a negative overshoot occurs and the time within which the level of the signal returns from the overshoot level to its desired level is termed the recovery time or fall time constant. The recovery time is optimally set for a comparitively long time, for example, in the range from several ten msec. to several hundred msec., that is, at least one hundred times the attack time. However, when the aforementioned effective value detecting circuit is used in a noise reduction circuit, the maximum ratio that can practically be obtained between the recovery time and attack time is approximately equal to 4. In such case, with a rapidly rising input signal, it is extremely likely that overshoots will be produced, thereby causing saturation of the recording medium and a consequent deterioration of the reproduced signal.

Further, it may be desirable to use different rise time constants for different input signals. In particular, it is desirable to use a relatively small or fast rise time constant for sharply rising high frequency, high level input signals so as to avoid the problem of deterioration in the quality of the reproduced sound due to encoder overshoot. In other words, since the encoding portion of the noise reduction circuit generally includes a limiter circuit for clipping the encoded signal for levels greater than a predetermined level, with a small rise time constant, clipping of the encoded signal may not be necessary so that only minimal saturation of the recording medium occurs, thereby preventing deterioration in the quality of the reproduced sound. On the other hand, it is also desirable to use a relatively large or slow rise time constant for low and intermediate signals and for high frequency, low level input signals to prevent deterioration of the reproduced sound quality due to phase distortion and the like, and to prevent adverse effects from noise in pulse form. It is therefore desirable to provide a level detecting circuit in which the rise time constant varies in accordance with the input signal in satisfaction of the aforementioned incompatible requirements.

OBJECTS AND SUMMARY OF THE INVENTION

Accordingly, it is an object of this invention to provide a level detecting circuit that avoids the above-described difficulties encountered with the prior art.

More particularly, it is an object of this invention to provide a level detecting circuit of the logarithmic compression type which converts the input signal into a direct current signal as a logarithmic function of the input signal level.

It is another object of this invention to provide a level detecting circuit having greater precision and which can produce desirable rise and fall time constants, while being used with a broad dynamic range.

It is still another object of this invention to provide a level detecting circuit which can be used with a broad dynamic range and which can vary the rise and fall time constants in accordance with the level of the input signal.

It is yet another object of this invention to provide a level detecting circuit that is simple in construction and inexpensive.

In accordance with an aspect of this invention, a level detecting circuit for producing a level detected output signal in response to an input signal, includes converting means for logarithmically converting the input signal to produce a logarithmically converted signal; amplifying means supplied with the logarithmically converted signal and a feedback signal for producing a logarithmically amplified signal in response thereto; integrating means for producing an integrated signal in response to the logarithmically amplified signal; semi-conductor means for supplying the logarithmically amplified signal to the integrating means; feedback means for producing the feedback signal in response to the logarithmically amplified signal and the integrated signal; and output means for producing the level detected output signal in response to the integrated signal.

The above, and other objects, features, and advantages of the present invention will become readily apparent from the ensuing detailed description of the illustrative embodiments of the invention which is to be read in connection with the accompanying drawings.

DETAILED DESCRIPTION OF THE PREFERRED EMBODIMENTS

Figure 1:
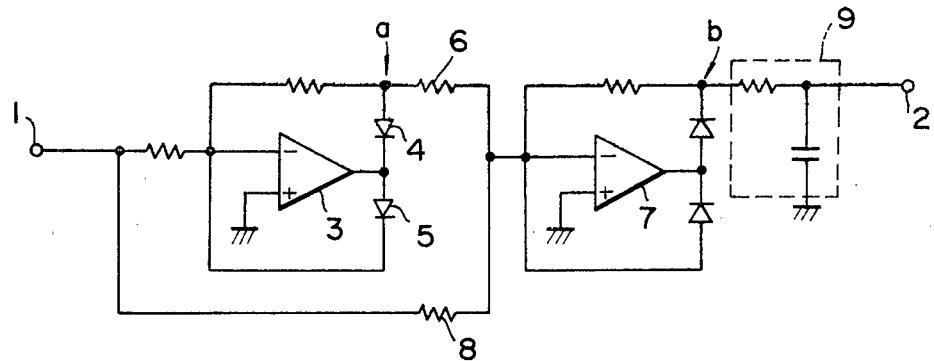
FIG. 1 is a circuit wiring diagram of a level detecting circuit of the full-wave rectification type according to the prior art.

Referring to the drawings in detail, and initially to FIG. 1 thereof, a linear level detecting circuit of the full-wave rectification type according to the prior art is supplied with an alternating current input signal at an input terminal 1 thereof. The alternating current input signal is supplied from input terminal 1 through a resistor to the inverting input of an operational amplifier 3. The noninverting input of operational amplifier 3 is grounded. The output from operational amplifier 3 is connected to the cathode of a diode 4 and the anode of a diode 5, with the anode of diode 4, in turn, being connected to a point a which is also connected through a resistor to the inverting input of operational amplifier 3. The cathode of diode 5, in turn, is also connected to the inverting input of operational amplifier 3. When the input signal supplied to input terminal 1 is positive, operational amplifier 3 inverts the signal and, at such time, diode 4 is turned ON and diode 5 is turned OFF so that only inverted positive portions, that is, negative portions of the inverted signal, are produced at point a.

On the other hand, if the input signal is negative, diode 4 is turned OFF and diode 5 is turned ON and, because of feedback through diode 5, a virtual ground exists at the input so that the output at point a equals 0. In other words, if the input signal is a sinusoidal signal, the circuit performs a half-wave rectification operation whereby only the inverted positive component of the input signal, that is only a negative component, is produced at point a.

This half-wave rectified signal is applied through a resistor 6 to the inverting input of a second operational amplifier 7 which is also supplied with the input signal from input terminal 1 through a resistor 8. It is to be appreciated that resistors 6 and 8 and operational amplifier 7 form an addition amplifying circuit. Two diodes are also formed at the output of operational amplifier 7 in much the same manner as the formation of diodes 4 and 5 with respect to amplifier 3, with the exception that the diodes at the output of amplifier 7 are reversed in polarity with respect to diodes 4 and 5 at the output of amplifier 3. If the resistance of resistor 8 is set at twice the resistance of resistor 6, a positive full-wave rectified output signal is obtained at point b with respect to the alternating current input signal supplied to input terminal 1. The full-wave rectified signal from point b is then smoothed by a smoothing circuit 9, which is shown as a low-pass filter comprised of a resistor and capacitor, and is then supplied to output terminal 2.

By using operational amplifier 3 to compensate for the forward voltage drops across diodes 4 and 5, a comparitively broad dynamic range can be obtained. It is to be noted that the theoretical limits of the dynamic range are determined by the supply source voltage and the off-set voltage of the circuit. In any event, a typical value of the dynamic range that can be obtained with the circuit of FIG. 1 is approximately 60 dB. However, where the desired dynamic range of the level detecting circuit exceeds 60 dB, it is preferable to utilize a level detecting circuit of the exponential-to-logarithmic conversion type or of the logarithmic compression type. Practically speaking, when a dynamic range greater than or equal to 40 to 50 dB is required, level detecting circuits of the exponential-to-logarithmic conversion type or of the logarithmic compression type are used.

Figure 2:
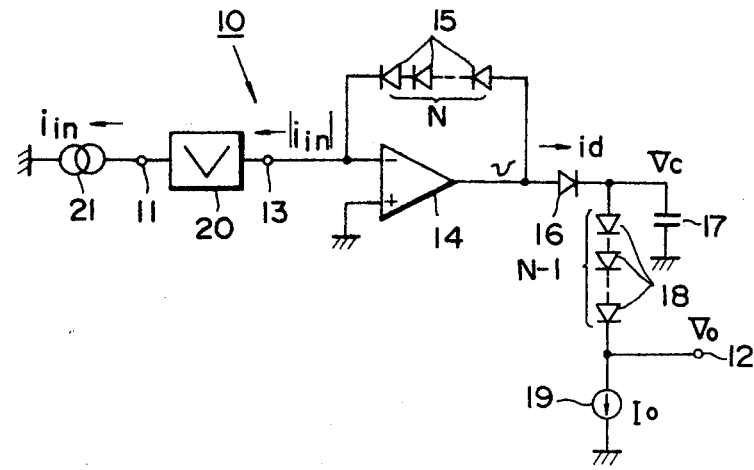
FIG. 2 is a circuit wiring diagram of a level detecting circuit of the logarithmic compression type according to the prior art.
Figure 3:
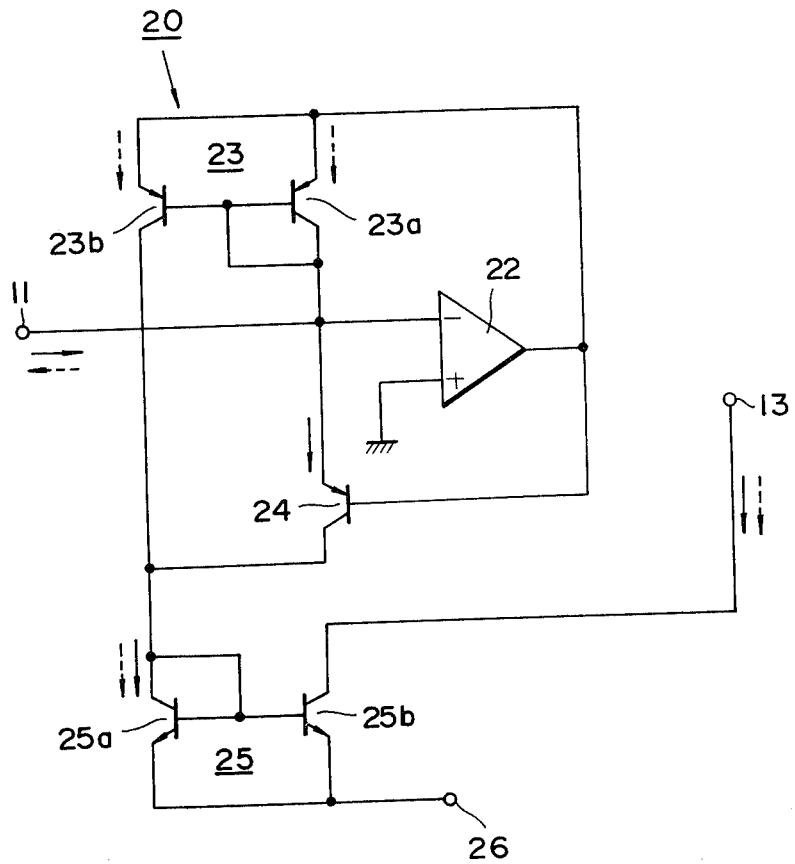
FIG. 3 is a circuit wiring diagram of an absolute value circuit that can be used in the level detecting circuit of FIG. 2.

Referring now to FIG. 2, a known level detecting circuit 10 of the logarithmic compression type is supplied at an input terminal 11 thereof with an input current $i_{in}$ from an input current source 21. The input current is supplied from input terminal 11 to an absolute value circuit 20 which functions as a high precision full-wave rectifier and which, in turn, supplies a full-wave rectified signal to a terminal 13. One embodiment of an absolute value circuit 20 that can be utilized in level detecting circuit 10 is shown in FIG. 3 to include an operational amplifier 22 having its inverting input connected to input terminal 11 and its non-inverting input grounded. The output of operational amplifier 22 is connected to the base of a PNP transistor 24 and to the emitters of two PNP transistors 23a and 23b, with the latter two transistors forming a current mirror circuit 23. In particular, the bases of transistors 23a and 23b are commonly connected to the collector of transistor 23a, to input terminal 11 and to the emitter of transistor 24. The collectors of transistors 23b and 24 are commonly connected to the collector of an NPN transistor 25a which, along with another NPN transistor 25b, form a second current mirror circuit 25. In the same manner as current mirror circuit 23, the bases of transistors 25a and 25b are commonly connected to the collector of transistor 25a, and the emitters of transistors 25a and 25b are commonly connected to a reference terminal 26. The output of absolute value circuit 20 is produced at the collector of transistor 25b and is supplied to terminal 13.

In operation, current in the positive or forward direction, that is, as indicated by the solid arrow, is supplied through input terminal 11 to the inverting input of operational amplifier 22 which functions to invert or reverse the current. Accordingly, transistor 24 is turned ON so that current in the forward direction from input terminal 11 is supplied through the emitter-collector path of transistor 24, as indicated by the solid arrow adjacent transistor 24. At this time, transistors 23a and 23b are turned OFF. The forward current flowing through the emitter-collector path of transistor 24 thereby flows through the emitter-collector path of transistor 25a of current mirror circuit 25, thereby causing current in the direction of the solid arrow to be produced at output terminal 13. On the other hand, current flowing in the negative or backward direction to input terminal 11, as indicated by the broken arrow thereat, is inverted by operational amplifier 22 which, in turn, produces a positive flowing current. Accordingly, at this time, transistor 24 is turned OFF. However, at this time, current flows through the emitter-collector path of transistor 23a of current mirror circuit 23, as indicated by the broken arrow, thereby causing current to flow through the emitter-collector path of transistor 23b in the forward direction as indicated by the broken arrow thereat. This latter current then flows through the emitter-collector path of transistor 25a. It is to be appreciated that the direction of current flow through transistor 25a is therefore the same, regardless of the direction of current flow at input terminal 11. Thus, regardless of the direction of current flow at input terminal 11, current flows in the same direction at terminal 13, as indicated by the solid and broken arrows thereat.

The output current signal at terminal 13 is supplied to the inverting input of an operational amplifier 14 which has its non-inverting input grounded. The output of amplifier 14 is connected to the input thereof through a plurality of N series connected diodes 15, whereby amplifier 14 and diodes 15 function to logarithmically amplify the input signal supplied thereto from terminal 13. The output from operational amplifier 14 is also connected through a diode 16 and a capacitor 17 to ground, and the connection or junction point between diode 16 and capacitor 17 is connected to a reference current source 19 through a plurality of (N−1) series connected diodes 18. The connection point between the (N−1) diodes 18 and current source 19 is connected to an output terminal 12 at which the level detected output signal is produced.

If the input current produced by input current source 21, regardless of the direction thereof, is designated by $i_{in}$, the output current from absolute value circuit 20 is designated by $|i_{in}|$, which represents the absolute value of the current from current source 21, and the saturation current of each of diodes 15, 16 and 18 is designated by $I_S$, the output voltage v from operational amplifier 14 can be obtained. In particular, the general expression for the voltage-current relation of a diode is expressed as follows:

$$i = I_S[\exp(-V/V_T) - 1] \tag{1}$$

If equation (1) is rearranged to solve for the voltage V across each diode 15, the output voltage v at the output of operational amplifier 14, taking into consideration the N diodes 15, is expressed as follows:

$$v = N \cdot V_T \ln\left(\frac{|i_{in}|}{I_S} + 1\right), \tag{2}$$

where the current flowing through diodes 15 is equal to the absolute value of the current from input current source 21, N represents the number of diodes 15, $V_T$ is Boltzmann's constant which is equal to kT/q, T is the absolute temperature and q is the element charge. In the transient state of operation, and considering the instantaneous value of the voltage $V_C$ across capacitor 17 to be fixed, the current $i_d$ through diode 16 can be expressed as follows:

$$i_d = I_S\left[\exp\left(\frac{v - V_C}{V_T}\right) - 1\right]. \tag{3}$$

If the voltage v from amplifier 14, as represented by equation (1), is substituted into equation (3), the current $i_d$ through diode 16 can be expressed as follows:

$$i_d = I_S\left[\left(\frac{|i_{in}|}{I_S} + 1\right)^N \cdot \exp\left(-\frac{V_C}{V_T}\right) - 1\right]. \tag{4}$$

On the other hand, during steady-state conditions, the steady-state current $\overline{i_d}$ is expressed as follows:

$$\overline{i_d} = \frac{1}{T} \int_0^T i_d dt. \tag{5}$$

If diode current $i_d$ from equation (4) is substituted into equation (5), the following equation is obtained:

$$\overline{i_d} = I_S\left[\frac{1}{T}\exp\left(-\frac{V_C}{V_T}\right) \int_0^T \left(\frac{|i_{in}|}{I_S} + 1\right)^N dt - 1\right]. \tag{6}$$

It is to be appreciated, however, that during steady-state conditions, $$\overline{i_d} = I_0 \tag{7}$$

If equations (6) and (7) are combined to eliminate the $\overline{i_d}$ term, and then solved for the voltage $V_C$ across capacitor 17, the following steady-state equation for capacitor voltage $V_C$ can be obtained:

$$V_C = \tag{8}$$

$$V_T\left[\ln\left\{\frac{1}{T}\int_0^T \left(\frac{|i_{in}|}{I_S} + 1\right)^N dt\right\} - \ln\left(\frac{I_0}{I_S} + 1\right)\right].$$

It should be readily apparent from FIG. 2 that the steady-state output voltage $V_O$ at output terminal 12 is equal to the steady-state capacitor voltage $V_C$ less the voltage drop across the (N−1) diodes 18. In other words, the steady-state output voltage $V_O$ can be expressed as follows:

$$V_O = V_C - V_T(N-1)\ln\left(\frac{I_O}{I_S} + 1\right). \tag{9}$$

If the steady-state capacitor voltage $V_C$ from equation (8) is substituted into equation (9), the equation for the steady-state output voltage $V_O$ can be rewritten as follows:

$$V_O = V_T\left[\ln\left(\frac{1}{T}\int_0^T\left(\frac{|i_{in}|}{I_S}+1\right)^N dt\right) - N\cdot\ln\left(\frac{I_O}{I_S}+1\right)\right]. \tag{10}$$

However, during steady-state conditions, $|i_{in}|$ and $I_O >> I_S$, so that the steady-state output voltage $V_O$ can be approximated as follows:

$$V_O \simeq V_T\left[\ln\left\{\frac{1}{T}\int_0^T\left(\frac{|i_{in}|}{I_S}\right)^N dt\right\} - \ln\left(\frac{I_O}{I_S}\right)^N\right]. \tag{11}$$

To simplify equation (11), the following equality is defined:

$$\overline{|i_{in}|^N} = \frac{1}{T}\int_0^T |i_{in}|^N dt. \tag{12}$$

If equation (12) is substituted into (11), the approximate steady-state value for the output voltage $V_O$ can be expressed as follows:

$$V_O \simeq V_T\ln\left(\frac{\overline{|i_{in}|}}{I_O}\right)^N. \tag{13}$$

It should be appreciated from equation (13) that the output voltage $V_O$ of level detecting circuit 10, which is of the logarithmic compression type, is obtained as a function of the Nth order of the absolute value of the input current $i_{in}$. As an example, when N=1, the steady-state output voltage $V_O$ corresponds to the average value of the input current, and when N=2, the steady-state output voltage $V_O$ corresponds to the effective value of the input current. In any event, level detecting circuit 10 of FIG. 2 is adapted to perform a level detecting operation for dynamic ranges of 80 dB or more. However, level detecting circuit 10 suffers from the disadvantage that the maximum fall-to-rise time constant ratio, that is, the ratio of recovery time to attack time, that can practically be obtained is equal to 4. In such case, when the level of the input signal sharply increases or rises, large overshoot portions will result. Accordingly, the transient response of logarithmic detecting circuit 10 must also be analyzed.

In logarithmic compression type conduits, the output signal that is actually used and evaluated is not the output signal $V_O$, but rather, an exponentially converted signal as a function of the output signal $V_O$. This exponential conversion is obtained by deriving a variable G(t) which is proportional to the input current $i_{in}$. In such case, G(t) is proportional to $(I_{in}{}^N)^{1/N}$ as t goes to infinity and is defined as follows:

$$G(t) = \exp\left[\frac{V_O(t)}{N\cdot V_T}\right]. \tag{14}$$

It is to be appreciated that in the above equation (14) and the equations to follow, the values of the output voltage $V_O$ and the capacitor voltage $V_C$ at any time t are denoted as $V_O(t)$ and $V_C(t)$, respectively. Further, in order to simplify the following equations, it is assumed that the input current is equal to $I_O$ when the level of the input signal is high and that the steady-state output voltage $V_O(t)=0$ at such time, that is, $G(t)=1$, at the start of the operation.

In order to study the transient response of the circuit, the response to a fall in the input signal will now be analyzed. In particular, for $t<0$, that is, during steady-state conditions before the input signal falls or drops, $i_{in} >> I_S$ and $i_{in}=I_O$ so that equation (1) for the voltage v at the output of operational amplifier 14 can be expressed as follows:

$$v \simeq N\cdot V_T\ln\frac{|i_{in}|}{I_S} = N\cdot V_T\ln\frac{I_O}{I_S}. \tag{15}$$

Further, during steady-state conditions, that is, where $i_{in}=I_O$, equation (13) for the output voltage $V_O$ can be expressed as follows:

$$V_O(t)=0 \tag{16}$$

On the other hand, when $t>0$, that is, after the input signal has fallen, the current $i_d$ through diode 16 is substantially equal to 0, whereby a constant current discharge from integrating capacitor 17, which has a capacitance C, is obtained due to the current $I_O$ from current source 19. In such case, the output voltage $V_O(t)$ can be expressed as follows:

$$V_O(t) = V_O(t)|_{t=0} - \frac{I_O}{C}t, \tag{17}$$

where the last term is the constant current discharge from capacitor 17. Since the output voltage $V_O$ does not change instantaneously at time $t=0$ from its previous condition given by equation (16), equation (17) can be simplified as follows:

$$V_O(t) = -\frac{I_O}{C}t. \tag{18}$$

If $V_O(t)$ from equation (18) is substituted into equation (14), an expression for the variable G(t) for time $t>0$ is obtained as follows:

$$G(t) = \exp\left(-\frac{I_O}{N\cdot V_T\cdot C}\cdot t\right). \tag{19}$$

Figure 4:
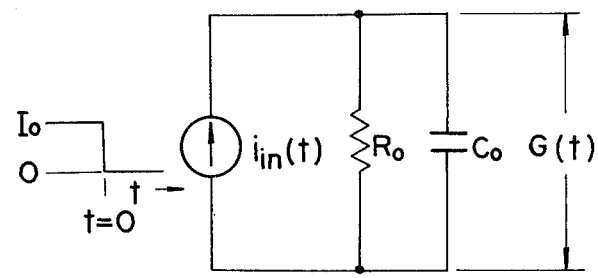
FIG. 4 is an equivalent circuit-wiring diagram of a portion of the level detecting circuit of FIG. 2, which is used for illustrating the fall time constant characteristic of the level detecting circuit of FIG. 2.

The variable G(t) in equation (19) can be expressed by an equivalent circuit, as shown in FIG. 4. In such circuit, the values of the resistance $R_0$ and capacitance $C_0$ are assigned the following values:

$$R_0 = 1/I_O \tag{20}$$

$$C_0 = N\cdot V_T C \tag{21}$$

It is to be appreciated, therefore, that the time constant $\tau$ for the circuit of FIG. 4 can be expressed as follows:

$$\tau = R_O C_O = N \cdot V_T C / I_O \quad (22)$$

For the rise time characteristic of level detecting circuit 10, the input current $i_{in}=0$ for $t<0$ and $i_{in}=I_0$ for $t>0$. At any time $t>0$, the current $i_d$ through diode 16, as represented by equation (3), can be approximated as follows:

$$i_d(t) \simeq I_S \cdot \exp \frac{v - V_C(t)}{V_T}, \quad (23)$$

where the saturation current $I_S$ is negligible compared to the remaining terms of the equation. Further, in such case, since the input current $i_{in}=I_0$, the voltage at the output of amplifier 14 can also be expressed by equation (15) which is rewritten below as equation (24):

$$v \simeq N \cdot V_T \ln \frac{|i_{in}|}{I_S} = N \cdot V_T \ln \frac{I_O}{I_S}. \quad (24)$$

By utilizing the fact that $I_O >> I_S$ and substituting equation (9) for the capacitor voltage $V_C(t)$ and equation (24) for the voltage v at the output of amplifier 14, equation (23) can be rewritten as follows:

$$i_d(t) \simeq I_O \cdot \exp\left[-\frac{V_O(t)}{V_T}\right]. \quad (25)$$

The rate of change of the output voltage $V_O(t)$ with respect to time, however, can be expressed as follows:

$$\frac{dV_O(t)}{dt} = \frac{i_d(t) - I_O}{C}. \quad (26)$$

Where the diode current $i_d(t)$ from equation (25) is substituted into equation (26), the latter equation can be rewritten as follows:

$$\frac{dV_O(t)}{dt} = \frac{I_O}{C}\left[\exp\left(-\frac{V_O(t)}{V_T}\right) - 1\right]. \quad (27)$$

If equation (14) is solved for the output voltage $V_O(t)$ and then substituted into equation (27), the following equation is obtained:

$$\frac{d[V_T \ln G(t)^N]}{dt} = \frac{I_O}{C}[G(t)^{-N} - 1]. \quad (28)$$

By taking the derivative of the left-hand side of equation (28) and then solving equation (28) for the derivative of the variable G(t) with respect to time, the following equation is obtained:

$$\frac{dG(t)}{dt} = \frac{I_O}{N \cdot V_T \cdot C}[G(t)^{(1-N)} - G(t)]. \quad (29)$$

Figure 5:
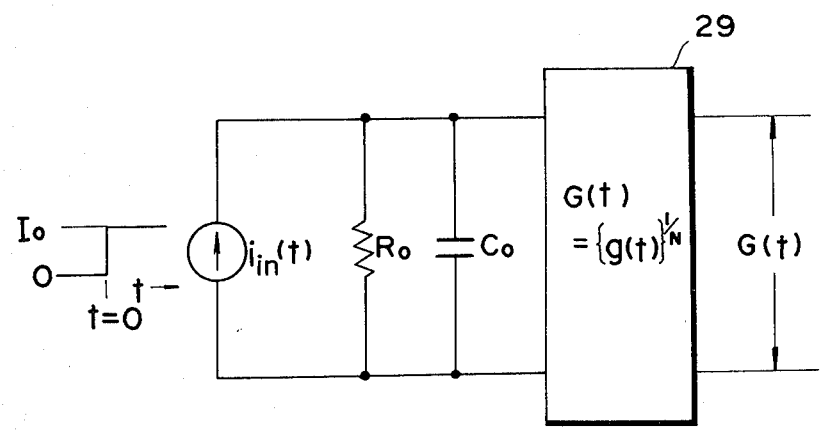
FIG. 5 is an equivalent circuit wiring diagram of a portion of the level detecting circuit of FIG. 2, which is used for illustrating the rise time constant characteristic of the level detecting circuit of FIG. 2.

Equation (29) represents the rise time characteristic for level detecting circuit 10 and may be expressed by an equivalent circuit, as shown in FIG. 5, in which the resistance $R_O$ and capacitance $C_O$ are expressed as follows:

$$R_O = 1/I_O \quad (30)$$

$$C_O = V_T C \quad (31)$$

The variable G(t) is produced in the equivalent circuit of FIG. 5 by a non-linear circuit 29 which provides an output G(t) expressed as follows:

$$G(t) = [g(t)]^{1/N} \quad (32)$$

where g(t) is the input to the non-linear circuit.

As previously discussed, it is desirable to provide an attack time or rise time constant as short as several 100 μsec. to several msec., while setting the recovery time or fall time constant in the range from several ten msec. to several 100 msec. In other words, it is to be appreciated that the recovery time should be several hundred times that of the attack time. With the level detecting circuit of FIG. 2, the rise and fall time constants are equal when N=1, with the rise time constant becoming faster with increasing N. It is therefore necessary to increase N to shorten or make faster the rise time constant so as to prevent overshoot for sharply rising input signals. This, however, causes various problems. In particular, with each increase in the value of N, the number of PN junctions from diodes 15 and 18 must be increased. This, in turn, increases the steady-state voltage drop so that low power source operation becomes difficult. If this deficiency is remedied by using a variable gain amplifier having a gain of N in place of the series connected PN junctions, the circuit construction becomes complicated. Further, the output voltage $V_O$ varies in correspondence to the Nth power of the input current in accordance with equation (13) which is rewritten as follows:

$$V_O = N \cdot V_T \ln\left[\left(\frac{i_{in}}{I_O}\right)^N\right]^{1/N}. \quad (33)$$

Thus, in order to control a logarithmically linear variable gain amplifier, either in a proportional or inversely proportional manner, an attenuator with an 1/N factor must be added, which further adds to the complication of the circuit.

Figure 6:
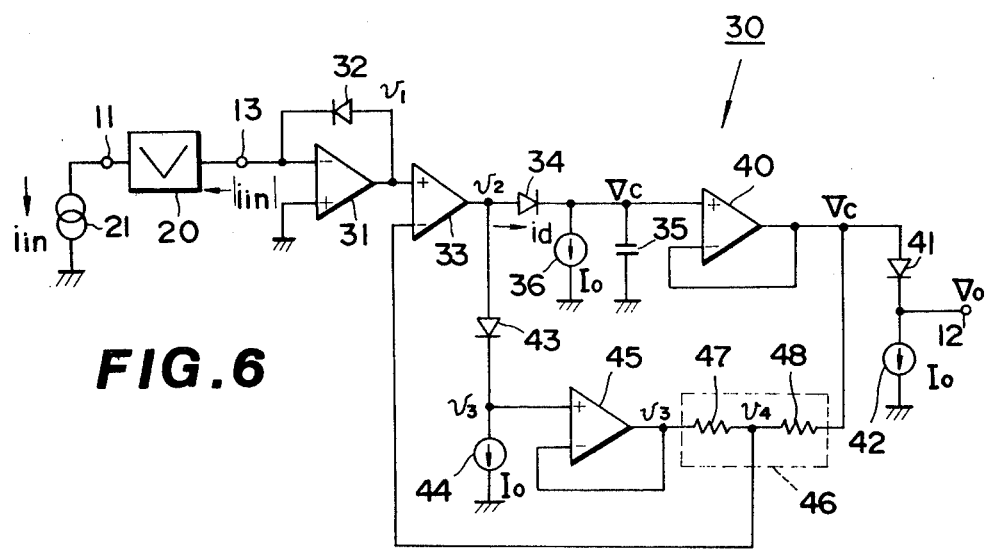
FIG. 6 is a circuit wiring diagram of a level detecting circuit according to one embodiment of this invention.

Referring now to FIG. 6, one embodiment of a level detecting circuit 30 according to this invention will now be described with elements corresponding to those described above with reference to the prior art circuit of FIG. 2 being identified by the same reference numerals. In particular, a current source 21 supplies an input current $i_{in}$ through an input terminal 11 to an absolute value circuit 20 which, in turn, supplies a signal $|i_{in}|$ corresponding to the absolute value of input current $i_{in}$ through a terminal 13 to the inverting input of an operational amplifier 31. The absolute value circuit of FIG. 3 may be used for absolute value circuit 20. The non-inverting input of operational amplifier 31 is grounded and the output of amplifier 31 is connected to the inverting input thereof through a single logarithmic converting diode 32. As will be appreciated from the discussion hereinafter, the present invention only requires the use of a single logarithmic converting diode, unlike the N plurality of diodes 15 in level detecting circuit 10 of FIG. 2. Output voltage $v_1$ of operational amplifier 31 is supplied to the non-inverting input of an operational amplifier 33 which functions as a differential error circuit that amplifies the difference between the voltage $v_1$ supplied to its non-inverting input and another voltage supplied to its inverting input.

The output voltage $v_2$ from amplifier 33 is supplied through a diode 34 to an integrating capacitor 35, the latter being connected between ground and diode 34. Further, a current source which supplies a reference current $I_0$ is connected between ground and the junction between diode 34 and capacitor 35. The capacitor voltage $V_C$ from capacitor 35 is then supplied to the non-inverting input of an operational amplifier 40 which functions as a voltage follower circuit and has it output connected to its inverting input. Accordingly, capacitor voltage $V_C$ is produced at the output of amplifier 40. The output of amplifier 40 is connected through a diode 41 to a current source 42, which provides a reference current $I_0$, and the connection point between diode 41 and reference current source 42 is connected to an output terminal 12 at which the output voltage $V_0$ of circuit 30 is produced.

As a feature of this invention, a voltage dividing circuit 46 is provided for producing a voltage divided feedback voltage $v_4$ which is related to the capacitor voltage $V_C$ at the output of amplifier 40 and to the voltage $v_2$ at the output of amplifier 33, and which is fed back to the inverting input of amplifier 33. In particular, the output voltage $v_2$ from amplifier 33 is supplied through a diode 43, which compensates for the steady-state voltage drop across diode 34, and the output $v_3$ from diode 43 is supplied to the non-inverting input of an operational amplifier 45, which functions as a voltage follower circuit. A reference current source 44 which produces a reference current $I_0$ is also connected to the non-inverting input of amplifier 45, and the output of amplifier 45 is connected to the inverting input thereof. It should be appreciated that voltage follower operational amplifiers 40 and 45 are provided to avoid any deleterious affect from directly using the capacitor voltage $V_C$ from capacitor 35 and the voltage $v_3$ from diode 43.

Voltage dividing circuit 46 is comprised of two series connected resistors 47 and 48 connected between the output of amplifier 45 and the output of amplifier 40, respectively, with the resistance of resistor 47 being selected as $(N-1)$ times the resistance of resistor 48. Accordingly, the input voltages $v_3$ and $V_C$ supplied to voltage dividing circuit 46 are voltage divided with a ratio of between $1/N$ for $V_C=0$ and $(N-1)/N$ for $v_3=0$.

With level detecting circuit 30, the logarithmically converted voltage $v_1$ at the output of operational amplifier 31 can be obtained in the same manner as the voltage $v$ obtained in regard to the circuit of FIG. 2, as expressed by equation (2), and can be expressed as follows:

$$v_1 = V_T \ln\left(\frac{|i_{in}|}{I_S} + 1\right). \tag{34}$$

Further, the voltage divided feedback voltage $v_4$ from voltage dividing circuit 46 is related to the two input voltages $v_3$ and $V_C$ supplied thereto as follows:

$$\frac{v_3 - v_4}{(N-1)R} = \frac{v_4 - V_C}{R}. \tag{35}$$

It is to be appreciated, however, that, as previously discussed, operational amplifier 33 functions as a differential error circuit and accordingly, because of the feedback path from voltage dividing circuit 46 to the inverting input thereof, the voltage divided feedback voltage $v_4$ from voltage dividing circuit 46 is equal to the voltage $v_1$ supplied to the non-inverting input of amplifier 33. Accordingly, by substituting voltage $v_1$ for voltage $v_4$ in equation (35) and rearranging the terms in this latter equation, the following equation for voltage $v_3$ is obtained:

$$v_3 = N \cdot v_1 - V_C(N-1) \tag{36}$$

If voltage $v_1$ from equation (34) is substituted into equation (36), the following equation is obtained:

$$v_3 = N \cdot V_T \ln\left(\frac{|i_{in}|}{I_S} + 1\right) - V_C(N-1). \tag{37}$$

It is to be appreciated that the output voltage $v_2$ from operational amplifier 33 is equal to the voltage $v_3$ plus the voltage drop across diode 43. In other words, voltage $v_2$ is represented by the following equation:

$$v_2 = N \cdot V_T \cdot \ln\left(\frac{|i_{in}|}{I_S} + 1\right) + V_T \cdot \ln\left(\frac{I_0}{I_S} + 1\right) \tag{38}$$
$$- V_C(N-1).$$

In much the same manner as equation (3) was derived, the current $i_d$ through diode 34 is expressed as follows:

$$i_d = I_S\left[\exp\left(\frac{v_2 - V_C}{V_T}\right) - 1\right]. \tag{39}$$

If the voltage $v_2$ from equation (38) is substituted into equation (39), the latter euqation can be rewritten as follows:

$$i_d = \tag{40}$$

$$I_S\left[\left(\frac{|i_{in}|}{I_S} + 1\right)^N \left(\frac{I_0}{I_S} + 1\right) \cdot \exp\left(-\frac{N \cdot V_C}{V_T}\right) - 1\right].$$

As previously discussed in regard to equations (5) and (7), the steady-state diode current $\overline{i_d}$ is expressed as follows:

$$\overline{i_d} = \frac{1}{T}\int_0^T i_d dt = I_0. \tag{41}$$

If the diode current $i_d$ from equation (40) is substituted into equation (41), the following new equation is obtained:

$$\bar{i_d} = I_S \left[ \frac{1}{T} \left( \frac{I_O}{I_S} + 1 \right) \cdot \exp\left( -\frac{N \cdot V_C}{V_T} \right) \right. \quad (42)$$

$$\left. \int_0^T \left( \frac{|i_{in}|}{I_S} + 1 \right)^N dt - 1 \right].$$

If the reference current $I_O$ is substituted for the steady-state diode current $\bar{i_d}$ in equation (42) and the latter equation is rearranged to solve for the capacitor voltage $V_C$, the following equation is obtained:

$$V_C = \frac{V_T}{N} \cdot \ln \left[ \frac{1}{T} \int_0^T \left( \frac{|i_{in}|}{I_S} + 1 \right)^N dt \right]. \quad (43)$$

Since the output voltage $V_O$ at output terminal 12 is equal to the capacitor voltage $V_C$ less the voltage drop across diode 41, the output voltage $V_O$ can be expressed as follows:

$$V_O = V_C - V_T \ln\left( \frac{I_O}{I_S} + 1 \right). \quad (44)$$

If the capacitor voltage $V_C$ from equation (43) is substituted into equation (44), the following new equation is obtained:

$$V_O = \frac{V_T}{N} \cdot \ln\left[ \frac{1}{T} \int_0^T \left( \frac{|i_{in}|}{I_S} + 1 \right)^N dt \right] - \quad (45)$$

$$V_T \cdot \ln\left( \frac{I_O}{I_S} + 1 \right).$$

As previously discussed in regard to the circuit of FIG. 2, during steady-rate conditions, the absolute value of the input current $i_{in}$ and the current $I_O >> I_S$ so that equation (45) can be approximated as follows:

$$V_O \simeq \frac{V_T}{N} \ln\left[ \frac{1}{T} \int_0^T \left( \frac{|i_{in}|}{I_S} \right)^N dt \right] - V_T \cdot \ln\left( \frac{I_O}{I_S} \right). \quad (46)$$

This equation can be simplified as follows:

$$V_O \simeq V_T \ln\left[ \frac{1}{T} \int_0^T \left( \frac{|i_{in}|}{I_O} \right)^N dt \right]^{1/N}. \quad (47)$$

In order to further simplify equation (47), we utilize the following definition:

$$\frac{1}{T} \int_0^T \left( \frac{|i_{in}|}{I_O} \right)^N dt = \overline{\left( \frac{i_{in}}{I_O} \right)^N}, \quad (48)$$

so that equation (47) reduces to:

$$V_O \simeq V_T \ln\left[ \overline{\left( \frac{|i_{in}|}{I_O} \right)^N} \right]^{1/N}. \quad (49)$$

It is to be appreciated that the aforementioned conversion of the input signal by level detecting circuit 30 according to this invention, which is of the logarithmic compression type, is independent of changes in the value of N. In this manner, a faster rise time constant or attack time can be achieved without deterioration of other characteristics of the circuit.

In the same manner as was previously done in regard to level detecting circuit 10 of FIG. 2, a variable G(t) which is proportional to the input current in circuit 30 is defined as follows:

$$G(t) = \exp\left[ \frac{V_O(t)}{V_T} \right]. \quad (50)$$

In order to study the transient response of level detecting circuit 30, the response to a fall or drop in the input signal will now be analyzed. In other words, when $t<0$, $i_{in}=I_O$ and when $t>0$, $i_{in}=0$. Further, as was the case with level detecting circuit 10 of FIG. 2, the steady-state output voltage $V_O(t)=0$ for $t<0$ and is equal to the discharge of integrating capacitor 35, caused by the constant current discharging of reference current $I_O$ from current source 42, when $t>0$. In other words, for $t>0$, the output voltage is expressed as follows:

$$V_O(t) = \frac{-I_O}{C} t. \quad (51)$$

If $V_O(t)$ from equation (51) is substituted into equation (50), the latter equation can be expressed as follows:

$$G(t) = \exp\left( -\frac{I_O}{V_T \cdot C} t \right). \quad (52)$$

On the other hand, for a rising input signal, $i_{in}=0$ for $t<0$ and $i_{in}=I_O$ for $t>0$. At any given time $t>0$, the current $i_d$ through diode 34, as represented by equation (39), can be approximated as follows:

$$i_d(t) \simeq I_S \cdot \exp\frac{v_2(t) - V_C(t)}{V_T}. \quad (53)$$

However, for $t>0$, $i_{in}=I_O>>I_S$. Thus, equation (38) reduces to:

$$v_2(t) \simeq V_T(N+1) \ln\left( \frac{I_O}{I_S} \right) - V_C(t)(N-1). \quad (54)$$

By using the relationship of equation (44) for the capacitor voltage $V_C$, the voltage difference $v_2(t) - V_C(t)$ can be obtained as follows:

$$v_2(t) - V_C(t) \simeq V_T \ln\left( \frac{I_O}{I_S} \right) - NV_O(t). \quad (55)$$

Accordingly, by substituting equation (55) into equation (53), the latter equation for the diode current $i_d(t)$ can be expressed as follows:

$$i_d(t) = I_O \cdot \exp\left(-\frac{N \cdot V_O(t)}{V_T}\right). \tag{56}$$

In the same manner as previously discussed in regard to equation (26), the rate of change of the output voltage $v_0(t)$ with respect to time can be expressed as follows:

$$\frac{dV_O(t)}{dt} = \frac{i_d(t) - I_O}{C}. \tag{57}$$

By substituting equation (56) for the diode current $i_d(t)$, equation (57) reduces as follows:

$$\frac{dV_O(t)}{dt} = \frac{I_O}{C}\left[\exp\left(-\frac{N \cdot V_O(t)}{V_T}\right) - 1\right]. \tag{58}$$

If equation (50) is rearranged in terms of the output voltage $V_O(t)$ and then substituted into equation (58), the latter equation can be rewritten as follows:

$$\frac{d[V_T \ln G(t)]}{dt} = \frac{I_O}{C}[G(t)^{-N} - 1]. \tag{59}$$

By taking the derivative of the left-hand side of equation (59) and then rearranging equation (59) for the derivative of variable $G(t)$ with respect to time, the following equation is obtained:

$$\frac{dG(t)}{dt} = \frac{I_O}{V_T C}[G(t)^{(1-N)} - G(t)]. \tag{60}$$

It is to be appreciated that equations (52) and (60) obtained for level detecting circuit 30 according to this invention correspond to equations (19) and (29). From these equations, it should be readily apparent that a circuit equivalent to that of the prior art of FIG. 2 can easily be obtained by multiplying the capacitance of integrating capacitor 35 by a factor of N without the necessity of using the plurality of diodes of the level detecting circuit of FIG. 2.

Figure 7:
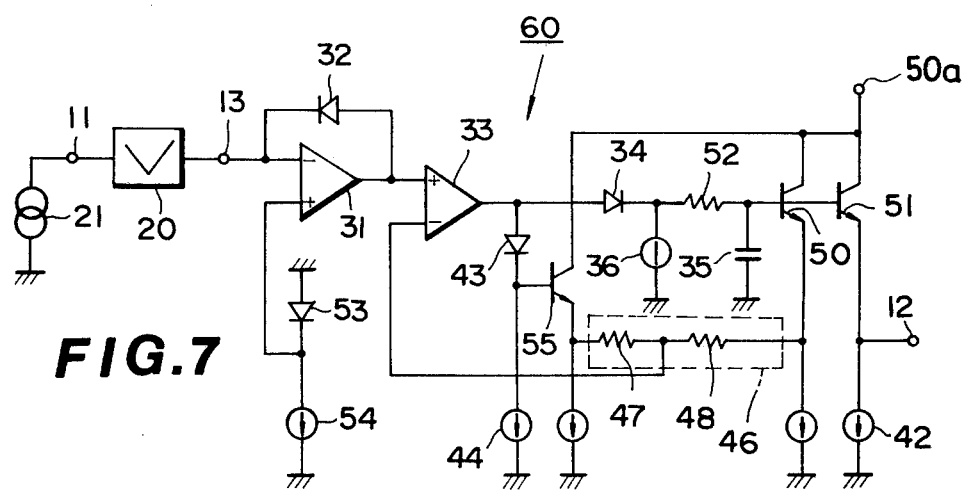
FIG. 7 is a circuit wiring diagram of a level detecting circuit according to another embodiment of this invention.

Referring now to FIG. 7, another embodiment of a level detecting circuit 60 according to this invention will now be described, with elements corresponding to those described above with reference to the level detecting circuit of FIG. 6 being identified by the same reference numerals, and with a description of such corresponding elements being omitted for the sake of brevity. In particular, level detecting circuit 60 includes two NPN transistors 50 and 55 in place of voltage follower operational amplifiers 40 and 45 of level detecting circuit 30. In addition, the cathode of diode 34 is connected to capacitor 35 and to the base of transistor 50 through a resistor 52, the latter of which functions to prevent excessive charging current from being supplied to integrating capacitor 35 that may result with a sharply rising input signal when large values of N are used, and which is used to approximate the rising of the first-degree time constant curve. Further, the base of transistor 55 is connected to the connection point between diode 43 and reference current source 44, and the collectors of transistors 50 and 55 are commonly connected to a reference voltage source terminal 50a. The emitter of transistor 50 is connected to a reference current source and also to resistor 48 of voltage dividing circuit 46 so as to supply the aforementioned capacitor voltage $V_C$ thereto. In like manner, the emitter of transistor 55 is connected to a reference current source and also to resistor 47 of voltage dividing circuit 46 for supplying the aforementioned voltage $v_3$ thereto. In addition, an NPN transistor 51 is provided in place of diode 41 and has its base and collector commonly connected to the base and collector of transistor 50, respectively, and its emitter connected to reference current source 42. The output voltage $V_O$ is obtained at the emitter of transistor 51. Further, a level shift circuit formed by a series circuit of a reference current source 54 and a diode 53 is provided between two ground terminals and the connection point therebetween is connected to the non-inverting input of operational amplifier 31.

Figure 8:
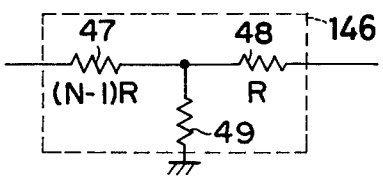
FIG. 8 is a circuit wiring diagram of a second embodiment of a voltage dividing circuit that can be used in the level detecting circuit of FIG. 6.

Level detecting circuit 30 of FIG. 6 may further be modified by replacing voltage dividing circuit 46 with a voltage dividing circuit 146, shown in FIG. 8. Accordingly, the output of voltage dividing circuit 146 may be set to a desired value by grounding the connection point between voltage dividing resistors 47 and 48 through a resistor 49. However, the voltage $v_4$ produced at the connection point between resistors 47 and 48 is still fed back to the inverting point of operational amplifier 33.

It should be appreciated that with the level detecting circuit according to the present invention, as shown in FIG. 6 and as modified by the circuits in FIGS. 7 and 8, it is possible to set a large value of N without deleteriously affecting the operation of the level detecting circuit and without excessively complicating the circuit. In particular, with the level detecting circuit according to this invention, there is no problem of a substantial voltage drop caused by the plurality of diodes used in the circuit of FIG. 2, whereby low power source operation is possible with large values of N. In addition, since the output voltage, as a function of the input signal, is not affected by changes in the value of N, there is no need for any 1/N attenuation circuit so that the output voltage can be connected directly to a logarithmic linear variable gain amplifier. Further, since the output voltage, as a function of the input signal, is not affected by changes in the value of N, it is possible to externally vary the value of N. This means that the response time constant, that is, the attack time and recovery time can be controlled in accordance with the level of the input signal. The level detecting circuit according to this invention demonstrates pronounced effects over that of the prior art circuit of FIG. 2 when $N > 3$.

Further, it may also be desirable to vary the response time constants in accordance with the level and frequency of the input signal. Generally, in noise reduction circuits, a weighting operation is performed for weighting the signal supplied to the level detecting circuit in accordance with the frequency thereof. For example, a highpass filter may be provided for weighting the high frequency components of the signal supplied thereto so as to reduce the effects of noise modulation. Thus, in accordance with another aspect of this invention, a high frequency weighting operation may be performed before supplying the signal to the level detecting circuit so as to provide a characteristic as a function of level and frequency. In this manner, a variable time constant characteristic can be obtained in accordance with the input signal such that a small or fast rise time constant (attack time) is provided only for high frequency, high level input signals and a larger or slower rise time constant is provided for high frequency, low level input signals and all intermediate and low frequency input signals.

Figure 9:
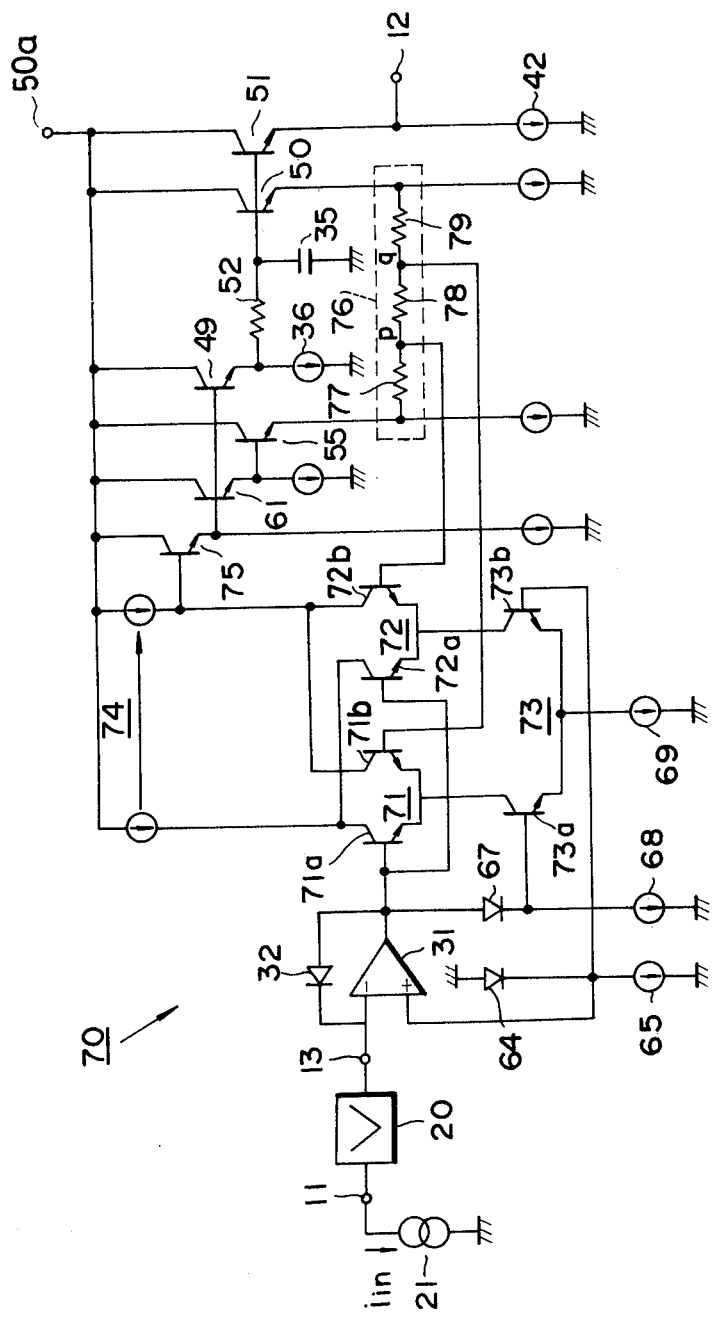
FIG. 9 is a circuit wiring diagram of a level detecting circuit according to another embodiment of this invention.

Referring now to FIG. 9, another embodiment of a level detecting circuit 70 of the logarithmic compression type according to this invention will now be described, with elements corresponding to those described above with reference to the level detecting circuit of FIG. 7 being identified by the same reference numerals, and with a detailed description of such corresponding elements being omitted for the sake of brevity. With level detecting circuit 70, a voltage dividing circuit 76 comprised of a series circuit of three resistors 77, 78 and 79 is provided in place of voltage dividing circuit 46 of FIGS. 6 and 7. Two outputs are obtained from voltage dividing circuit 76, at the connection point p between resistors 77 and 78 and the connection point q between resistors 78 and 79, and are supplied to a differential amplifier system comprised of differential amplifiers 71, 72 and 73 for varying the value of the aforementioned division ratio N. It is to be appreciated that voltage dividing circuit 76 is connected between the emitters of transistors 55 and 50 in the same manner as previously described in regard to level detecting circuit 60 of FIG. 7.

As shown in FIG. 9, two differential amplifiers 71 and 72 are connected between the output of operational amplifier 31 and the outputs of voltage dividing circuit 76. In particular, differential amplifier 71 is comprised of a first NPN transistor 71a having its base connected to the output of operational amplifier 31 and a second NPN transistor 71b having its base connected to the q output terminal of voltage dividing circuit 76, with the emitters of transistors 71a and 71b being connected together. In like manner, differential amplifier 72 is comprised of a first NPN transistor 72a having its base connected to the output of operational amplifier 31 and a second NPN transistor 72b having its base connected to the p output terminal of voltage dividing circuit 76, with the emitters of transistors 72a and 72b being connected together. The collectors of transistors 71a and 72a are commonly connected to a first current source of a current inverter or mirror circuit 74 and the collectors of transistors 71b and 72b are commonly connected to the other current source of current inverter circuit 74. It is to be appreciated that the current sources of current inverter circuit 74 are connected so that the same current flows from each current source.

A third differential circuit 73 is provided and is comprised of a first NPN transistor 73a having its collector connected to the commonly connected emitters of transistors 71a and 71b, and a second NPN transistor 73b having its collector connected to the commonly connected emitters of transistors 72a and 72b, with the emitters of transistors 73a and 73b being commonly connected to a reference current source 69. The output of operation amplifier 31 is connected to a reference current source 68 through a diode 67, and the connection point between diode 67 and current source 68 is connected to the base of transistor 73a. Further, a series circuit comprised of a diode 64 and a reference current source 65 is connected between two ground potentials, and the junction point therebetween is connected to the non-inverting input of operational amplifier 31 and to the base of transistor 73b. In this manner, the base of transistor 73b is connected to a potential which is shifted by an amount corresponding to the forward voltage drop across diode 64, and the base of transistor 73a is connected to a point having a potential which is shifted through a diode 67 and constant current source 68 with respect to the logarithmically converted output from operational amplifier 31. Accordingly, the current through transistors 73a and 73b varies in accordance with the level of the input current $i_{in}$.

When the level of the input current $i_{in}$ is very low, the potential at the base of transistor 73a is considerably lower than the potential at the base of transistor 73b so that substantially all of the current from constant current source 69 flows through differential circuit 73 to differential amplifier 72. At this time, and considering that the two differential amplifiers 71 and 72 function as a single operational amplifier, the base of transistor 72b functions as an inverting input terminal of such single operational amplifier, while the base of transistor 72a, which is supplied with the output from operational amplifier 31, functions as the non-inverting input of such single operational amplifier. On the other hand, when the level of input current $i_{in}$ is sufficiently high, substantially all of the current from constant current source 69 flows through differential circuit 73 to differential amplifier 71. In such case, the base of transistor 71a, which is supplied with the output from operational amplifier 31, functions as the non-inverting input of such single operational amplifier, while the base of transistor 71b, which is supplied with the output from the q terminal of voltage dividing circuit 76, functions as the inverting input of such single operational amplifier.

In such case, it is to be appreciated that voltage dividing circuit 76 can be set so that the voltage dividing ratio N is large when the level of the input signal is high and is small when the level of the input signal is low. Since the rise time constant (attack time) is shorter or faster for greater values of N, the rise time constant is varied in accordance with the level of the input signal so as to be relatively slow or long for low level input signals and relatively fast for high level input signals. It is to be appreciated that the common emitter current through the two differential amplifiers 71 and 72 is not varied in a switching manner, but rather, is changed continuously in accordance with the level of the input signal. In this manner, for intermediate level input signals, the rise time constant is intermediate the aforementioned fast and slow rise time constants obtained for high level and low level input signals, respectively. In fact, the greatest change in the rise time constant is obtained when the current supplied to the emitters of differential amplifiers 71 and 72 is at the same level, and this level can be varied by constant current source 68.

Further, an NPN emitter-follower transistor 75 has its base connected to one of the current sources of current inverter circuit 74 and its emitter connected to a constant current source, with the output of transistor 75 being taken from its emitter. It should therefore be appreciated that differential amplifiers 71 and 72, current inverter circuit 74 and emitter-follower transistor 75 are provided in place of operational amplifier 33 of FIGS. 6 and 7. In addition, emitter-follower transistors 49, 61 and 51 are provided for current gain in place of diodes 34, 43 and 41 in the circuit of FIG. 6, and emitter-follower transistors 50 and 55 are provided as voltage followers in place of operational amplifiers 40 and 45 of the circuit of FIG. 6, as previously discussed in regard to level detecting circuit 60 of FIG. 7. In such case, the direct current level shift stemming from the base-emitter PN junctions of transistors 55 and 50 is compensated for by the aforementioned diode 64 and constant current source 65.

It is to be appreciated that all of the above embodiments provide distinct advantages over the level detecting circuit of the logarithmic compression type according to the prior art. In particular, with level detecting circuit 30 of FIG. 6, the voltage division ratio N can be set to a large value to obtain a faster rise time constant (attack time) without deteriorating the low power characteristic of the circuit and without unduly complicating the circuit. In addition, in accordance with the present invention, the response time constants can be varied in accordance with the input signal level, unlike the level detecting circuit of the logarithmic compression type according to the prior art which is designed for use with a broad dynamic range. Accordingly, a sufficiently fast rise time constant for high frequency, high level input signals and a relatively slow rise time constant for high frequency, low level input signals and all intermediate and low frequency input signals can be obtained. In this manner, when the level detecting circuit according to this invention is used in a noise reduction circuit, the effects of noise in pulse form, and deterioration of the sound quality, is minimized.

It is to be appreciated that various modifications can be made with the above circuit, within the scope of the present invention. For example, the voltage dividing circuits 46 and 76 may be replaced with a variable resistance means which provides a variable resistance in accordance with the level of the input signal so as to directly control the dividing ratio N.

Having described specific preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A level detecting circuit for producing a level detected output signal in response to an input signal, comprising:
converting means for logarithmically converting said input signal to produce a logarithmically converted signal;
amplifying means supplied with said logarithmically converted signal and at least one feedback signal for producing a logarithmically amplified signal in response thereto;
integrating means for producing an integrated signal in response to said logarithmically amplified signal;
semiconductor means for supplying said logarithmically amplified signal to said integrating means;
feedback means for producing said at least one feedback signal in response to said logarithmically amplified signal and said integrated signal, said feedback means including voltage dividing means for producing said at least one feedback signal in response to said logarithmically amplified signal and said integrated signal, first means for supplying said logarithmically amplified signal to said voltage dividing means, and second means for supplying said integrated signal to said voltage dividing means, said voltage dividing means including a first resistive element and a second resistive element connected in series between said first and second means, said second resistive element having a first resistance and said first resistive element having a second resistance which is (N−1) times the first resistance, N>2, and a feedback signal being produced at the connection point between said first and second resistive elements; and
output means for producing said level detected output signal in response to said integrated signal.

2. A level detecting circuit according to claim 1; in which said converting means includes an operational amplifier having an inverting input and an output, and semiconductor means connected between said inverting input and said output of said operational amplifier.

3. A level detecting circuit according to claim 2; in which said semiconductor means includes a diode.

4. A level detecting circuit according to claim 1; in which said amplifying means includes an operational amplifier having a non-inverting input supplied with said logarithmically converted signal and an inverting input supplied with said at least one feedback signal.

5. A level detecting circuit according to claim 1; in which said semiconductor means includes PN junction means.

6. A level detecting circuit according to claim 1; in which said integrating means includes a capacitive element connected between said semiconductor means and a reference potential.

7. A level detecting circuit according to claim 1; in which said connection point is connected to ground through a third resistive element.

8. A level detecting circuit according to claim 1; in which said output means includes second PN junction means supplied with said integrated signal for producing said level detected output signal in response thereto.

9. A level detecting circuit according to claim 8; in which said second PN junction means includes one of a transistor and a diode.

10. A level detecting circuit for producing a level detected output signal in response to an input signal, comprising:
converting means for logarithmically converting said input signal to produce a logarithmically converted signal;
amplifying means supplied with said logarithmically converted signal and at least one feedback signal for producing a logarithmically amplified signal in response thereto;
integrating means for producing an integrated signal in response to said logarithmically amplified signal;
semiconductor means for supplying said logarithmically amplified signal to said integrating means;
feedback means for producing said at least one feedback signal in response to said logarithmically amplified signal and said integrated signal, said feedback means including voltage dividing means for producing said at least one feedback signal in response to said logarithmically amplified signal and said integrated signal, first means for supplying said logarithmically amplified signal to said voltage dividing means, and second means for supplying said integrated signal to said voltage dividing means, said voltage dividing means including a first resistive element and a second resistive element connected in series between said first and second means, and a feedback signal being produced at the connection point between said first and second resistive elements, said first means including PN junction means and first voltage follower means connected between said amplifying means and said first resistive element, and said second means including second voltage follower means connected between said integrating means and said second resistive element; and output means for producing said level detected output signal in response to said integrated signal.

11. A level detecting circuit according to claim 10; in which said first voltage follower means includes an operational amplifier having an input supplied with said logarithmically amplified signal through said PN junction means and having an output for supplying said logarithmically amplified signal to said first resistive element, and said second voltage follower means includes an operational amplifier having an input supplied with said integrated signal and having an output for supplying said integrated signal to said second resistive element.

12. A level detecting circuit according to claim 10, in which said first voltage follower means includes a first transistor having an input supplied with said logarithmically amplified signal through said PN junction means and having an output for supplying said logarithmically amplified signal to said first resistive element, and said second voltage follower means includes a second transistor having an input supplied with said integrated signal and having an output for supplying said integrated signal to said second resistive element.

13. A level detecting circuit for producing a level detected output signal in response to an input signal, comprising:

converting means for logarithmically converting said input signal to produce a logarithmically converted signal;

amplifying means supplied with said logarithmically converted signal and at least one feedback signal for producing a logarithmically amplified signal in response thereto;

integrating means for producing an integrated signal in response to said logarithmically amplified signal;

semiconductor means for supplying said logarithmically amplified signal to said integrating means;

feedback means for producing said at least one feedback signal in response to said logarithmically amplified signal and said integrated signal;

said feedback means producing a first feedback signal and a second feedback signal, and said amplifying means including first differential amplifier means supplied with said logarithmically converted signal and said first feedback signal, second differential amplifier means supplied with said logarithmically converted signal and said second feedback signal and means for controlling the operation of said first and second differential amplifier means in accordance with the level of said input signal; and output means for producing said level detected output signal in response to said integrated signal.

14. A level detecting circuit according to claim 13; in which said first differential amplifier means includes first and second transistors, each having an emitter commonly connected to a current source, with said first transistor having a base supplied with said logarithmically converted signal and said second transistor having a base supplied with said first feedback signal; and said second differential amplifier means includes third and fourth transistors, each having an emitter commonly connected to said current source, with said third transistor having a base supplied with said logarithmically converted signal and said fourth transistor having a base supplied with said second feedback signal.

15. A level detecting circuit according to claim 14; in which said means for controlling includes third differential amplifier means connected between said current source and said first and second differential amplifier means for controlling the current flow through said first and second differential amplifier means in accordance with the level of said input signal.

16. A level detecting circuit according to claim 15; in which said third differential amplifier means includes a fifth transistor having a base supplied with said logarithmically converted signal, an emitter connected to said current source and a collector connected to the emitters of said first and second transistors, and a sixth transistor having a base connected to an input of said converting means, an emitter connected to said current source and a collector connected to the emitters of said third and fourth transistors.

17. A level detecting circuit according to calim 13; in which said feedback means includes voltage dividing means for producing said first and second feedback signals in response to said logarithmically amplified signal and said integrated signal, first means for supplying said logarithmically amplified signal to said voltage dividing means, and second means for supplying said integrated signal to said voltage dividing means.

18. A level detecting circuit according to claim 17; in which said voltage dividing means includes first, second and third resistive elements connected in series between said first and second means, said first feedback signal being produced at the connection point between said first and second resistive elements and said second feedback signal being produced at the connection point between said second and third resistive elements.

19. A level detecting circuit according to claim 18; in which said first means includes PN junction means and first voltage follower means connected between said amplifying means and said first resistive element, and said second means includes second voltage follower means connected between said integrating means and said third resistive element.

20. A level detecting circuit according to claim 19; in which said first voltage follower means includes a first transistor having an input supplied with said logarithmically amplified signal through said PN junction means and having an output for supplying said logarithmically amplified signal to said first resistive element, and said second voltage follower means includes a second transistor having an input supplied with said integrated signal and having an output for supplying said integrated signal to said third resistive element.

* * * * *